United States Patent [19]

Maio et al.

[11] Patent Number: 4,752,767
[45] Date of Patent: Jun. 21, 1988

[54] DA CONVERTER

[75] Inventors: Kenji Maio, Suginami; Shinichi Hayashi, Hachioji; Masao Hotta, Hanno, all of Japan

[73] Assignee: Hitachi, Ltd., Tokyo, Japan

[21] Appl. No.: 752,588

[22] Filed: Jul. 8, 1985

[30] Foreign Application Priority Data

Jul. 9, 1984 [JP] Japan ................................ 59-140510

[51] Int. Cl.[4] ............................................ H03M 1/66
[52] U.S. Cl. ............................................ 340/347 DA
[58] Field of Search ................................ 340/347 DA

[56] References Cited

U.S. PATENT DOCUMENTS 3,588,880 6/1971 Gross ........................... 340/347 DA
3,646,549 2/1972 Bryden ....................... 340/347 DA
3,979,561 9/1976 Hinkle .................. 340/347 DA UX
4,016,555 4/1977 Tyrrel .......................... 340/347 DA

OTHER PUBLICATIONS

Evans, "IBM Technical Disclosure Bulletin", vol. 24, No. 1A, Jun. 1981, pp. 227-228.

Primary Examiner—Charles D. Miller
Attorney, Agent, or Firm—Antonelli, Terry & Wands

[57] ABSTRACT

The present invention provides a DA converter of the type wherein a group of switch circuits are controlled in response to input digital signals and a plurality of constant current sources are driven in response to on and off of the switch circuits to convert the input digital signals into analogue signals, the DA converter comprising a plurality of lineages of digital input circuits for controlling the switch circuits, whereby digital signals inputted to the input circuits are changed over in order for each lineage to DA convert them.

2 Claims, 8 Drawing Sheets

DA CONVERTER

BACKGROUND OF THE INVENTION

This invention relates to a DA converter (hereinafter referred to as a DAC), and particularly to a DAC which is suitable for a high speed converting operation.

A typical application of DACs is in a high definition display system, such as a computer terminal.

A high definition display system of the raster scan type having 1000 to 2000 scanning lines requires 100 to 500 MHz as its data renewal frequency.

A first drawback in such systems is that it is difficult to develop individual input bit data of a DAC in timed relationship at a speed as high as 500 MHz. A second drawback is in dispersion of transmission times of data transmitted to individual input bits of a DAC. For example, in a system wherein the data renewal frequency is 500 MHz, the period is 2 ns, and hence it is desirable that the dispersion of transmission times be less than a fraction of that. But it is very difficult to attain this because of dispersion of characteristics, such as data line length.

A third drawback resides in glitches (hair-like noises which may appear upon changing of data) and responsiveness of a DAC. Since glitches appear as noises on a display picture, they need be controlled to a low level to a degree. A DAC of the segment type is as a DA converting means which effectively controls glitches (refer, for example, to ISSCC, 1978, THPM142).

Figure 9:
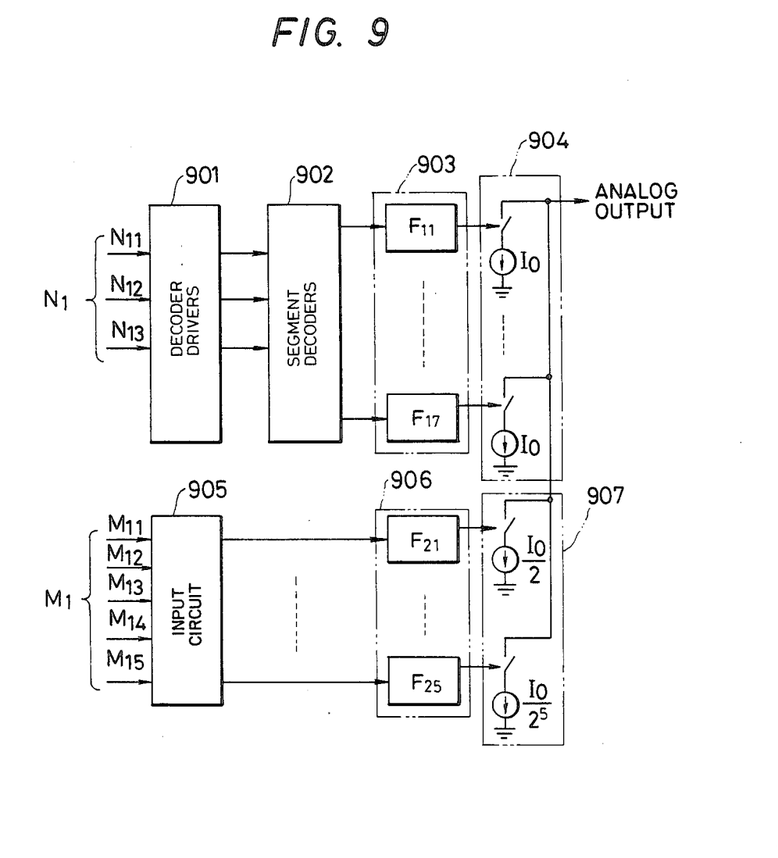
FIG. 9 is a schematic view showing a general construction of a conventional DA converter of the segment type.

A theoretical representation of a DAC of the segment type is given in FIG. 9 which illustrates a construction of an 8 bit DAC wherein the means mentioned above is applied to the upper 3 bits. In particular, the DAC includes decoder drivers 901 for inputting the upper 3 bits, segment decoders 902, a group of flipflops 903, a first group 904 of switches connected to constant current sources, an input circuit 905 for inputting lower input bits, another group of flipflops 906, and another group 907 of switches connected to constant current sources. Thus, the upper n bits (n=3 in FIG. 9) to which glitches readily appear are converted into the decimal system by the segment decoders 902 to control a number determined by the decimal number of constant current outputting switches of the $2^n-1$ similar constant current sources disposed in the latter stage. According to the arrangement, even upon switching of the upper bits which will normally cause the highest glitches, that is, where n=3, upon switching between 011 and 100, the numbers of the constant current sources from which an output is taken change from 3 to 4, and hence there is only a change of 1 therebetween, resulting in glitches lower than that. Accordingly, glitches become lower than $\frac{1}{2}^n-1$ of the glitches which may appear in a conventional arrangement. However, in this arrangement, decoder output signals must necessarily be produced in timed relationship, and hence the flipflops F11 to F17 must be provided for the decoder outputs.

A fourth drawback resides in responsiveness of the DAC. Particularly, it is difficult, with the existing IC techniques to attain operation of a decoder or a latch at 500 MHz. If this should be possible, since it is necessary to reduce the impedance of a circuit system to attain a high speed, a large electric current is required, resulting in an increase of the power consumption, which makes the IC impractical as an IC.

SUMMARY OF THE INVENTION

It is an object of the present invention to provide a high speed DA converter which can be realized with existing IC techniques by eliminating such drawbacks of conventional DA converters and allows reduction of power consumption, inhibition of appearance of glitches, and so on.

In order to attain the above object, according to the present invention, a DA converter of the type wherein a group of switched constant current circuits are controlled in response to an input digital signal to provide an analogue signal corresponding to on and off operation of the switched constant current circuits is characterized in that it comprises a plurality of digital input circuits for controlling the switched constant current circuits whereby a plurality of digital inputs are changed over to DA convert them one after another.

DESCRIPTION OF THE PREFERRED EMBODIMENTS

Now, preferred embodiments will be described in detail with reference to the accompanying drawings.

Figure 1:
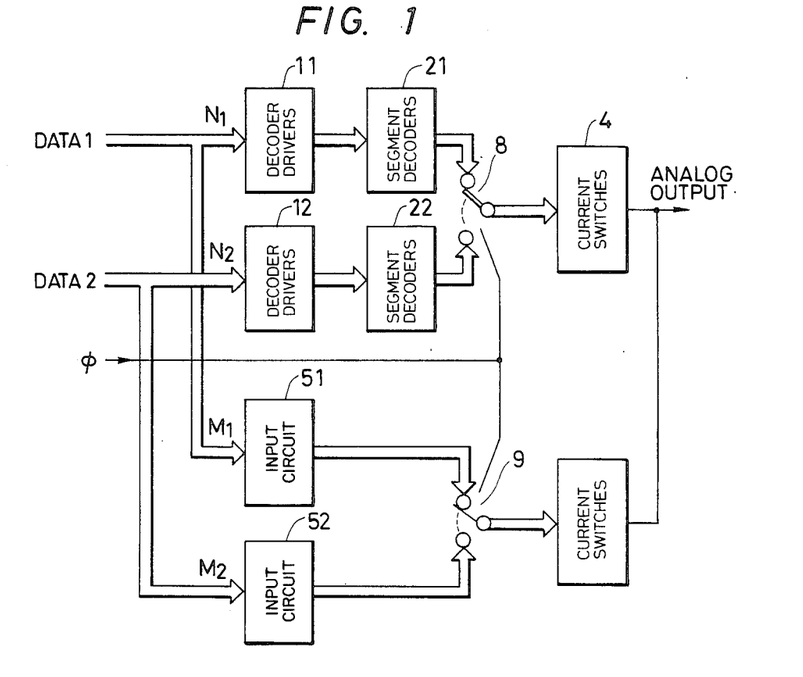
FIG. 1 is a schematic view showing a general construction of a DA converter according to an embodiment of the present invention.
Figure 2:
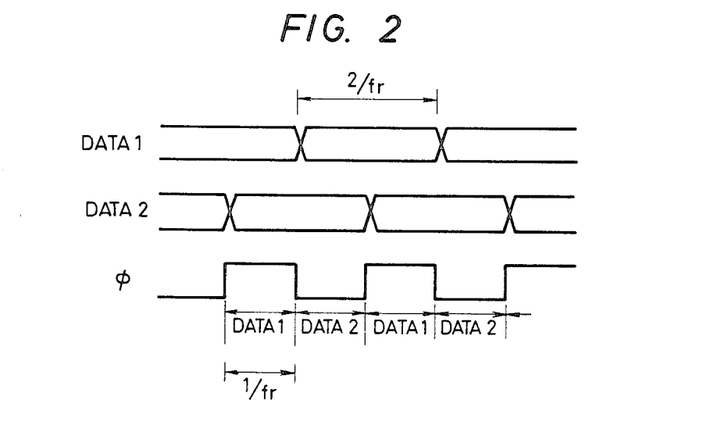
FIG. 2 is a timing chart of signals at portions of the converter of FIG. 1.

FIG. 1 is a schematic view showing a general construction of a DA converter according to an embodiment of the present invention, and FIG. 2 is a timing chart of signals at portions of the converter of FIG. 1.

In the present invention, as seen in FIG. 1, digital input data is pepared in two channels (data 1 and data 2) and are each divided into a group of upper input bits (N1 and N2) and a group of lower input bits (M1 and M2) with the upper input bits being inputted to segment decoders 21 and 22 via decoder circuits 11 and 12, respectively. Meanwhile, the lower bits are inputted to input circuits 51 and 52. Outputs of the decoders for the two channels and outputs of the input circuits for the two channels are alternately changed over by digital switches 8 and 9, respectively, to alternately produce analogue outputs corresponding to the data 1 and data 2. Here, if data production timings for the two channels and changing over timings of the digital switches are made as shown in FIG. 2, the following advantages would be provided. A first advantage is that allowable range of dispersion of transmission times can be twice of that a conventional system since the data renewal frequency for the data 1 and data 2 can be half of the data conversion frequency f of the analogue outputs. A second advantage is that glitches arising from dispersion of signal delays can be eliminated and at the same time the previously required flipflops can be omitted since changing over of the digital switches can be effected at once for all the signals after the data has become sufficiently stabilized, avoiding a transition time for data renewal. A third advantage is that, since the frequency of signals to be inputted to a data producing stage, the decoder, the decoders and the input circuits for the lower bits may be f/2, that is, half of that of the conventional systems, those named circuits can be implemented satisfactorily with existing IC techniques, and since the impedances employed can be made relatively high, the power consumption can be reduced.

As described above, a high speed DAC free of glitches can be realized using relatively low speed circuits but with slight increase in the circuit scale.

Here, while the decoders, switches and current switches are shown as independent blocks in FIG. 1, there actually exist another type wherein the decoders and switches are integrated and a further type wherein all the decoders, switches and constant current switches are integrated. In addition, it is also possible to interpose the change-over switches between the decoder drivers and the decoders to collect the decoders into a single channel to reduce the circuit scale. In this case, the decoders should operate at a similar speed to that of the conventional systems.

As for the lower bits, there exist a structure wherein the input circuits and switches are integrated, and another structure wherein the input circuits, switches and constant current switches are all integrated.

Besides, while the arrangement of FIG. 1 employs DACs of the segment type for the upper bits and DACs of the binary coded load type for the lower bits, it is otherwise possible to employ DACs either of the segment type or of the binary coded load type for all the bits.

Meanwhile, it is apparent that data may be provided in three or more channels to further moderate an allowable range for data delays of data producing and transmission circuits and a DAC input stage.

Figure 3:
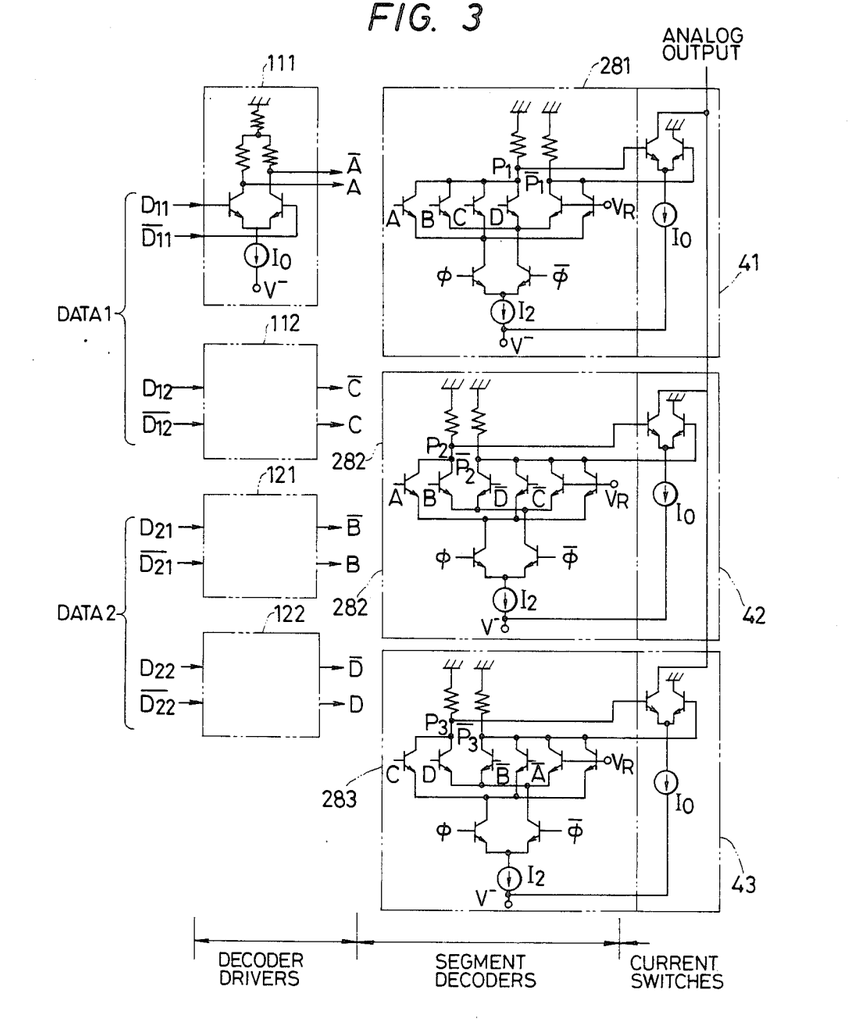
FIG. 3 is a circuit diagram of a construction of a portion of the DA converter for upper bits, illustrating a concrete form of the invention.

FIG. 3 is a circuit diagram of a construction of a portion of the DA converter for upper bits, illustrating a concrete form of the invention.

The DA converter receives D11 and D12 as data 1 and D21 and D22 as data 2. Decoder input circuits 111, 112, 121 and 122 have internal resistances which are determined to provide the following relationship among individual output voltage levels of the decoder driver circuits 111 to 122: in particular, where voltage levels of logical "1" of A, $\overline{A}$, ... D, $\overline{D}$ are represented by $V_{AH}$, $V_{\overline{A}H}$, ... $V_{DH}$, $V_{\overline{D}H}$ while those of logical "0" are represented by $V_{AL}$, $V_{\overline{A}L}$, ... $V_{DL}$, $V_{\overline{D}L}$, respectively, $$V_{AH} = V_{\overline{A}H} = V_{BH} = V_{\overline{B}H} > V_{CH} = V_{\overline{C}H} = V_{DH} = V_{\overline{D}H}$$
$$> V_R > V_{AL} = V_{\overline{A}L} = \ldots V_{DL} = V_{\overline{D}L} \quad (1)$$

Outputs of the decoder driver circuits 111 to 122 are inputted to segment decoders 281 to 283 in a subsequent stage. The segment decoders for both routes of the data 1 and data 2 are each constructed from 6 transistors selectively connected to poles A, B, C and D and their respective inverted poles and also to $V_R$ as inputs thereto, and changing over between the two routes is effected by a current switch circuit which receives a change-over signal $\phi$ and $\overline{\phi}$. Output of each segment decoder appears at a load resistor and is inputted to a constant current switch circuit in a subsequent stage.

Now, it is assumed that D11="0" and D12="1" are inputted as data 1 and D21="1" and D22="1" as data 2. At first, a case where $\phi$="1", that is, where the route for the data 1 is selected. In this case, since A=$V_{AH}$, $\overline{A}$=$V_{\overline{A}L}$, C=$V_{CL}$ and $\overline{C}$=$V_{\overline{C}H}$, decoder outputs P1 to P3 become "0", "0" and "1", respectively, from the relationship of the representation (1) above, and hence $I_o$ flows as an analogue output. Then, in another case where $\phi$=0, if the data 2 is selected, since B=$V_{BL}$, $\overline{B}$=$V_{\overline{B}H}$, D=$V_{DL}$ and $\overline{D}$=$V_{\overline{D}H}$, P1 to P3 now become "1", "1" and "1", respectively, and hence $3I_o$ is obtained as an analogue output.

Figure 4:
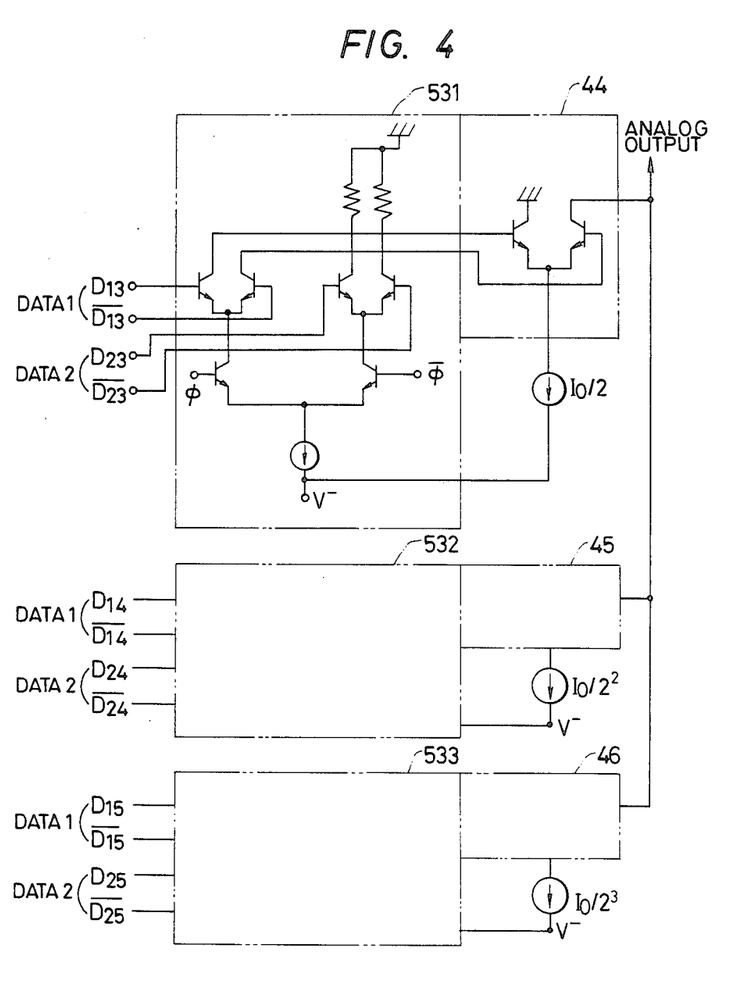
FIG. 4 is a circuit diagram of a construction of another portion of the DA converter for lower bits, illustrating the concrete form of the invention.

Now, an embodiment of a portion of the DA converter for the lower bits will be described with reference to FIG. 4 which gives illustration for lower 3 bits. Input circuits 531 to 533 for the 3 bits each contain therein a current changing over circuit and alternately provides an output for the data 1 and for the data 2 to control one and off operation of switches 44 to 46 of the constant current switches. Where the constant current of the segment DAC of the upper stage is represented by $I_o$, the constant current sources provide electric currents having binary coded load current values like $I_o/2$, $I_o/2^2$ and $I_o/2^3$ in order from the top stage. Output currents are coupled to the analogue output of the segment DAC of the higher stage as an analogue output thereto.

Figure 5:
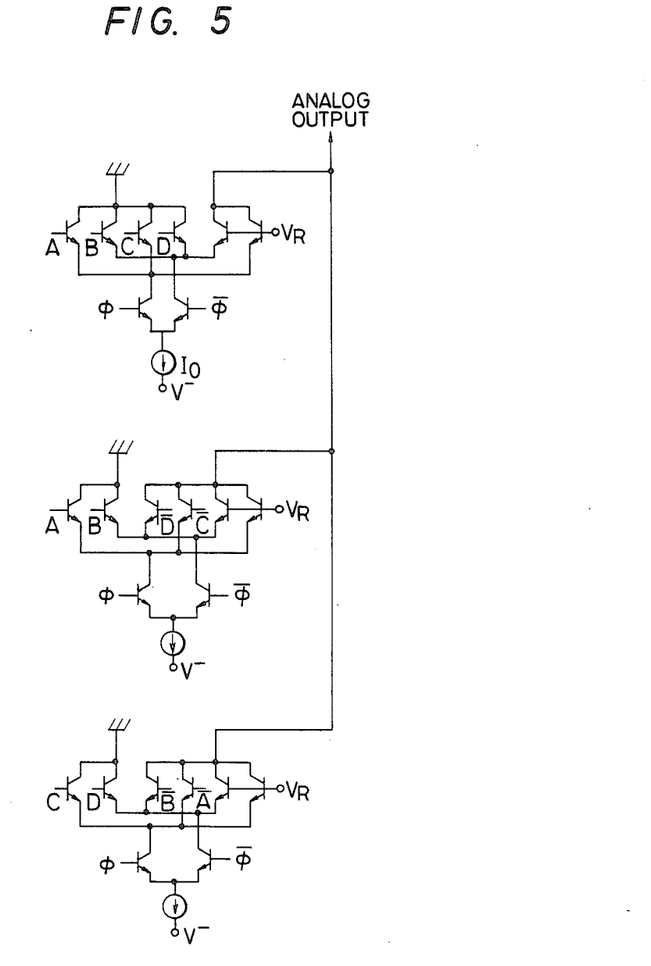
FIG. 5 is a circuit diagram of a construction of a portion of the DA converter for upper bits, illustrating another concrete form of the invention.

While FIG. 3 illustrates a construction wherein the decoders and the data change-over switches are integrated, a different embodiment wherein the constant current switches are also integrated is illustrated in FIG. 5. The decoder input circuits are omitted in FIG. 5 since they are the same as in FIG. 3.

The present embodiment employs the constant current sources of the decoders for constant electric currents of the segment DACs and hence presents an advantage of simplification of the circuitry and reduction of power consumption.

Figure 6:
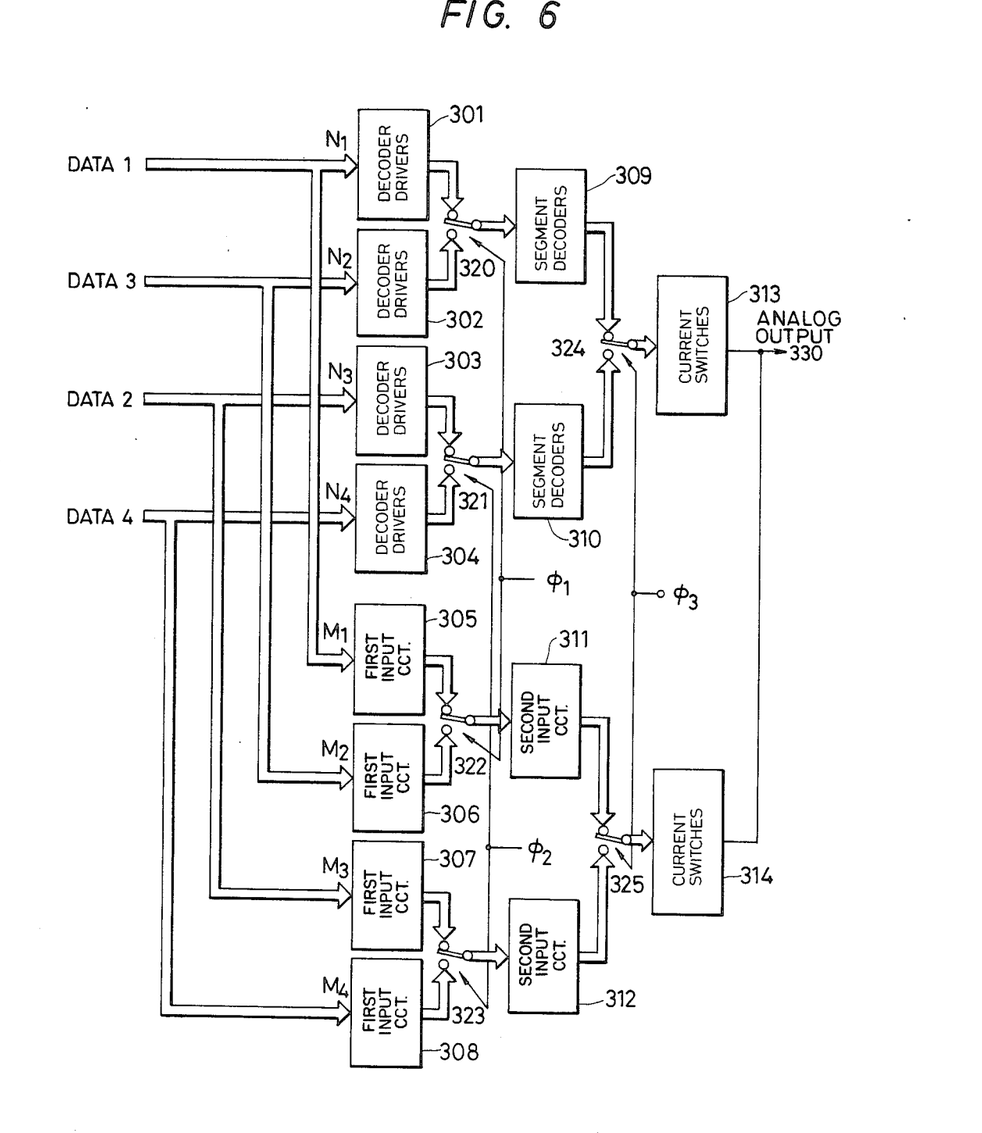
FIG. 6 is a schematic view showing a general construction of a DA converter according to another embodiment of the invention.
Figure 7:
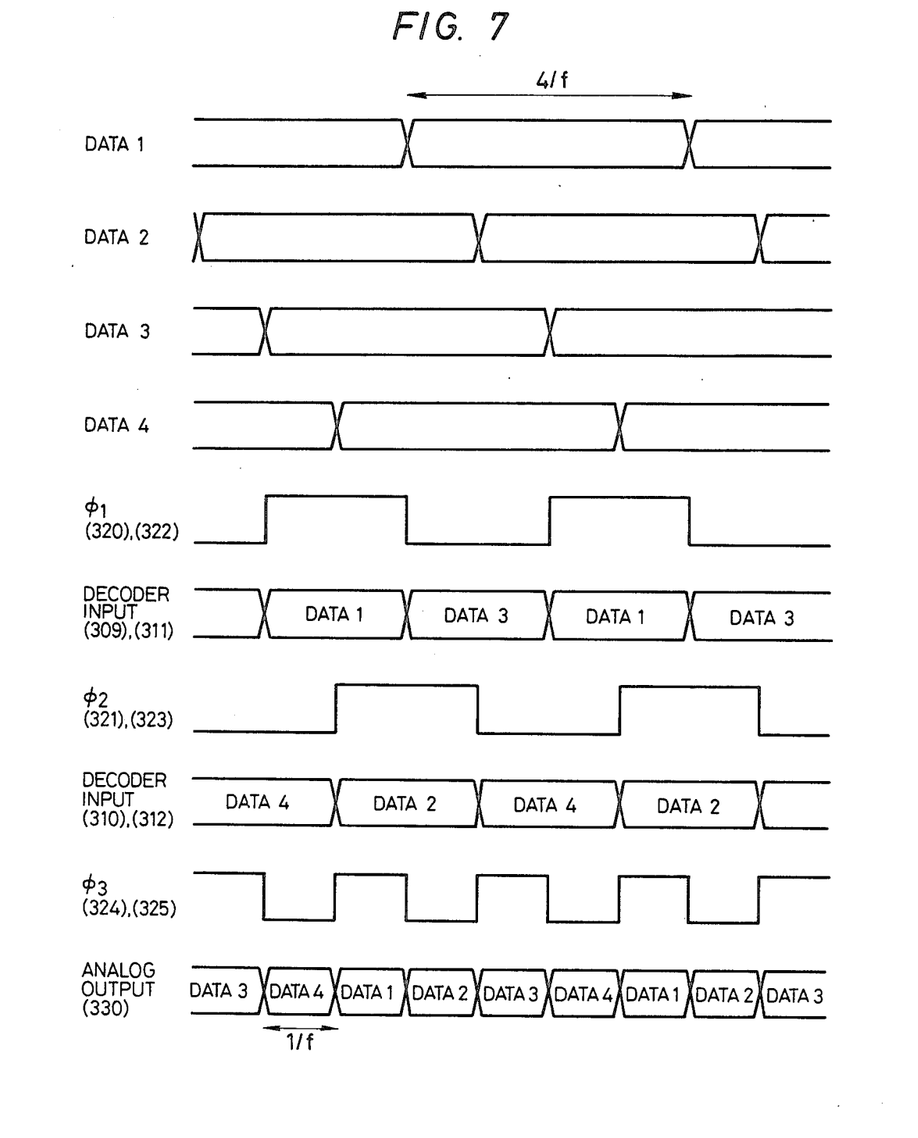
FIG. 7 is a timing chart of signals at portions of the converter of FIG. 6.

FIG. 6 is a schematic view showing a general construction of a DA converter according to another embodiment of the invention, and FIG. 7 is a timing chart of signals at portions of the converter of FIG. 6.

In the present invention, as seen in FIG. 6, digital input data are prepared in four channels (data 1, 2, 3 and 4) and are each divided into a group of upper input bits N1, N2, N3 and N4 and a group of lower input bits M1, M2, M3 and M4 with the upper input bits inputted to decoder driver circuits 301, 302, 303 and 304 while the lower bits are inputted to first input circuits 305, 307, 306 and 308. Decoder input circuits 301 and 302 as well as 303 and 304 are changed over by clocks $\phi$1 as seen in FIG. 7, and the first input circuits 305 and 306 as well as 307 and 308 are changed over clocks $\phi$2 as seen in FIG. 7. Meanwhile, decoders 309 and 310 and second input circuits 311 and 312 are changed over by clocks $\phi$3 as seen in FIG. 7. Here, if data production timings for the four channels and changing over timings of the digital switches are effected such as shown in FIG. 7, the following advantages would be provided.

A first advantage is that an allowable range of dispersion of transmission times can be four times that of a conventional system since the data renewal frequency for the data 1 to 4 can be f/4 of the data conversion frequency f of the analogue outputs. A second advantage is that glitches arising from dispersion of signal delays can be eliminated and at the same time the previously required flipflops can be omitted since changing over of the digital switches can be effected at once for all the signals after the data has become sufficiently stabilized, avoiding a transition time for data renewal. A third advantage is that, since the frequency of signals to be inputted to the data producing stage, the decoder input circuits 301 to 304 and the input circuits for the lower bits may be f/4, that is, half of that of a conventional segment DAC, those named circuits can be realized satisfactorily with existing IC techniques, and since the impedances employed can be made relatively high, the power consumption can be reduced.

As seen from FIG. 7, by inputting the data 1 to 4 with their phases displaced by four times the period 4/f from each other, the data 1 and data 3 are alternately taken in by clocks $\phi 1$, the data 2 and data 4 alternately by clocks $\phi 2$, and finally the data 1 to 4 are taken in in a period of 1/f by clocks $\phi 3$.

In this manner, in the DAC as shown in FIG. 6, the number of transistors in the input portions of the input circuits becomes four times and the number of transistors in the decoding portions of the decoders becomes twice, somewhat increasing the circuit scale. However, a high speed DAC causing no glitches can be realized using relatively low speed circuits.

It is to be noted here that while the decoders 309 and 310, second input circuits II 311 and 312, switches 320 to 325 and constant current 313 and 314 are shown as independent blocks in FIG. 6, there actually exist another type wherein the decoder driver circuits 301 to 304 and switches 320 and 321 are integrated and a further type wherein the decoders 309 and 310, switches 324 and 325 and constant current switch 313 are integrated. In addition, as for the lower bits, there exist a structure wherein the first input circuits and switches 322 and 323 are integrated, and another structure wherein all the second input circuits, switch 325 and constant current source 314 are integrated.

Besides, while the arrangement of FIG. 6 employs DACs of the segment type for the upper bits and DACs of the binary coded load type for the lower bits, it is otherwise possible to employ DACs either of the segment type or of the binary coded load type for all the bits.

Meanwhile, if the data is expanded up to $2^n$ channels ($n \geq 3$), an allowable range for data delays of data producing and transmission circuits and a DAC input stage can be further moderated.

Figure 8:
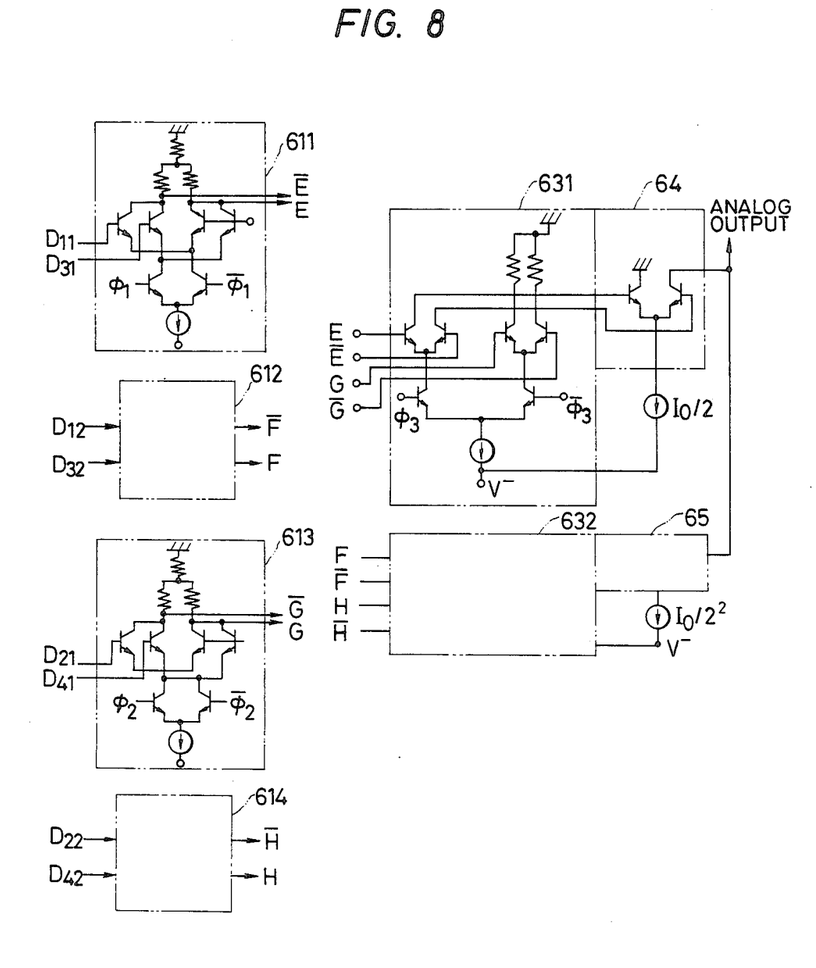
FIG. 8 is a circuit diagram of a portion of the DAC for lower bits, illustrating a concrete form of the invention.

FIG. 8 is a circuit diagram of a portion of the DAC for the lower bits illustrating a concrete form of the present invention.

FIG. 8 gives representation only for the lower two bits. First input circuits 611 to 614 for the two bits each contain therein a current change-over circuit and provide outputs corresponding to the data 1 to data 4 in order in response to changing over of $\phi 1$ and $\phi 2$. The outputs of the first input circuits 611 to 614 are inputted to second input circuits 631 and 632. Also the second input circuits 631 and 632 each include therein a current change-over circuit and alternately provide outputs corresponding to the data 1 and 3 or the data 2 and 4 to control switches 64 and 65 of constant current sources. Where the constant current of the segment DAC of the upper stage is represented by $I_o$, the constant current sources provide electric currents having binary coded load current values like $I_o/2$, $I_o/2^2$ and $I_o/2^3$ in order from the top stage. Output currents are connected in parallel to the outputs of the constant current sources and are coupled to the analogue output of the segment DAC of the higher stage as an analogue output thereto.

In this manner, according to the present invention, an operational speed of input circuits of a DAC except constant current switch circuits in an analogue current producing stage can be reduced below $\frac{1}{2^n}$ of a converting frequency of the DAC. This yields the following advantages: (a) an allowable range of dispersion of signal delays of a digital data producing system and a data transmission system can be moderated to higher than $2^n$ times; (b) reduction of power consumption can be made possible by increasing the impedances of the input circuits; (c) a DAC can be realized easily with the existing IC techniques; (d) clock signals for controlling changing over of data in response thereto can be produced simply since they may be sinusoidal waves; and so on. In addition, according to the invention, since changing over of data is effected by internally contained switches, timings at which data is to be applied to constant current switch circuits can be easily arranged or adjusted, which yields the following advantages: (e) no glitches will arise from dispersion of signal delays, (f) a DAC requires no latch circuit; and so on.

As apparent from the foregoing description, according to the present invention, a high speed DA converter can be realized easily with the existing IC techniques, and it is made possible to reduce power consumption and to prevent glitches from being caused by dispersion of signal delays.

What is claimed is:

1. A DA converter for converting input digital data into an analog signal, said input digital data being in the form of a plurality of channels of sequential digital signals, the sequential digital signals for each channel being offset in phase with respect to the sequential digital signals of the other channels, comprising:
   (a) a group of constant current sources to be selected according to said input digital data so that the sum of the currents of selected constant current sources becomes representative of said analog signal;
   (b) a plurality of sets of input means, each set being connected to receive a respective channel of said input digital data for generating a respective set of control signals according to respective input digital data;
   (c) digital switches connected to said plurality set of input means for sequentially selecting one set of input means which generate said control signals; and
   (d) control switches, each being connected to a respective one of said constant current sources and having emitter coupled first and second transistors, the common emitter thereof being connected to a constant current source, the collectors of said first transistors of said control switches being connected in common to an output terminal, and either one of said first and second transistors being driven to an ON state in response to said control signals generated by a selected set of said input means so that a current which sequentially follows said respective channels of input digital data flows at said output terminal.

2. A DA converter for converting input digital data into an analog signal, said input digital data being in the form of a plurality of channels of sequential digital signals, the sequential digital signals of each channel being offset in phase with respect to the sequential digital signals of the other channels, comprising:

(a) a group of equal weighted constant current sources to be selected according to said input digital data so that the sum of the currents of selected constant current sources becomes representative of said analog signal;

(b) a plurality of sets of segment decoders, each set generating a respective set of control signals according to respective input digital data;

(c) a plurality of sets of decoder drivers, each set being connected to drive a respective set of said segment decoders in response to respective input data;

(d) digital switches connected to said plurality of sets of segment decoders for sequentially selecting one set of segment decoders which generate said control signals; and (e) control switches, each being connected to a respective one of said constant current sources and having emitter coupled first and second transistors, the common emitter thereof being connected to a constant current source, the collectors of said first transistors of said control switches being connected in common to an output terminal, and either one of said first and second transistors being driven to an ON state in response to said control signals generated by a selected set of said segment decoders so that a current which sequentially follows said respective channels of input digital data flows at said output terminal.

* * * * *